(12) United States Patent
Choi et al.

(10) Patent No.: US 9,299,800 B2
(45) Date of Patent: Mar. 29, 2016

(54) METHODS OF MANUFACTURING HIGH ELECTRON MOBILITY TRANSISTORS

(71) Applicant: Samsung Electronics Co., Ltd., Suwon-si, Gyeonggi-do (KR)

(72) Inventors: Hyuk-soon Choi, Hwaseong-si (KR); Jung-hee Lee, Daegu (KR); Jai-kwang Shin, Anyang-si (KR); Jae-joon Oh, Seongnam-si (KR); Jong-bong Ha, Yongin-si (KR); Jong-seob Kim, Hwaseong-si (KR); In-jun Hwang, Hwaseong-si (KR); Ki-ha Hong, Cheonan-si (KR); Ki-sik Im, Daegu (KR); Ki-won Kim, Daegu (KR); Dong-seok Kim, Daegu (KR)

(73) Assignees: Samsun Electronics Co., Ltd., Gyeonggi-do (KR); Kyungpook National University Industry-Academic Cooperation, Sangyeok-Dong (KR)

( * ) Notice: Subject to any disclaimer, the term of this patent is extended or adjusted under 35 U.S.C. 154(b) by 0 days.

(21) Appl. No.: 14/687,488

(22) Filed: Apr. 15, 2015

(65) Prior Publication Data

US 2015/0221746 A1 Aug. 6, 2015

Related U.S. Application Data

(62) Division of application No. 13/178,902, filed on Jul. 8, 2011, now abandoned.

(30) Foreign Application Priority Data

Oct. 6, 2010 (KR) ........................ 10-2010-0097417

(51) Int. Cl.
*H01L 29/66* (2006.01)
*H01L 21/762* (2006.01)
*H01L 29/08* (2006.01)
*H01L 29/20* (2006.01)
(Continued)

(52) U.S. Cl.
CPC ...... *H01L 29/66462* (2013.01); *H01L 21/0254* (2013.01); *H01L 21/76237* (2013.01); *H01L 29/0847* (2013.01); *H01L 29/201* (2013.01); *H01L 29/2003* (2013.01); *H01L 29/205* (2013.01); *H01L 29/4236* (2013.01); *H01L 29/7787* (2013.01); *H01L 29/207* (2013.01)

(58) Field of Classification Search
None
See application file for complete search history.

(56) References Cited

U.S. PATENT DOCUMENTS 4,830,980 A * 5/1989 Hsieh .................. H01L 21/7605
257/274
5,521,404 A * 5/1996 Kikkawa ................ B82Y 10/00
257/18

(Continued)

FOREIGN PATENT DOCUMENTS

JP 2000068497 A 3/2000
JP 2008053436 A 3/2008
(Continued)

*Primary Examiner* — Evren Seven
(74) *Attorney, Agent, or Firm* — Harness, Dickey & Pierce, P.L.C.

(57) ABSTRACT

The methods may include forming a first material layer on a substrate, increasing electric resistance of the first material layer, and forming a source pattern and a drain pattern, which are spaced apart from each other, on the first material layer, a band gap of the source and drain patterns greater than a band gap of a first material layer.

7 Claims, 10 Drawing Sheets

(51) Int. Cl.
*H01L 29/423* (2006.01)
*H01L 29/778* (2006.01)
*H01L 21/02* (2006.01)
*H01L 29/201* (2006.01)
*H01L 29/205* (2006.01)
*H01L 29/207* (2006.01)

(56) References Cited

U.S. PATENT DOCUMENTS

| | | | |
|---|---|---|---|
| 5,762,706 A * | 6/1998 | Saito | C30B 25/02 117/103 |
| 5,955,742 A | 9/1999 | Kikkawa | |
| 6,294,801 B1 | 9/2001 | Inokuchi et al. | |
| 6,351,000 B1 | 2/2002 | Oikawa | |
| 6,452,221 B1 | 9/2002 | Lai et al. | |
| 6,465,289 B1 | 10/2002 | Streit et al. | |
| 7,364,988 B2 | 4/2008 | Harris et al. | |
| 7,408,182 B1 | 8/2008 | Smart et al. | |
| 7,429,534 B2 | 9/2008 | Gaska et al. | |
| 7,456,444 B2 | 11/2008 | Bito | |
| 8,431,459 B2 | 4/2013 | Takenaka et al. | |
| 2001/0015437 A1* | 8/2001 | Ishii | H01L 21/0242 257/12 |
| 2001/0023964 A1 | 9/2001 | Wu et al. | |
| 2002/0079508 A1 | 6/2002 | Yoshida | |
| 2005/0023555 A1 | 2/2005 | Yoshida et al. | |
| 2006/0118824 A1 | 6/2006 | Otsuka et al. | |
| 2007/0018198 A1 | 1/2007 | Brandes et al. | |
| 2007/0023897 A1 | 2/2007 | Nakajima et al. | |
| 2008/0006845 A1 | 1/2008 | Derluyn et al. | |
| 2009/0050936 A1 | 2/2009 | Oka | |
| 2009/0072240 A1* | 3/2009 | Suh | H01L 29/2003 257/76 |
| 2009/0191674 A1 | 7/2009 | Germain et al. | |
| 2010/0109051 A1 | 5/2010 | Wu et al. | |
| 2011/0006346 A1 | 1/2011 | Ando et al. | |
| 2011/0068371 A1* | 3/2011 | Oka | H01L 29/66462 257/194 |
| 2011/0278644 A1* | 11/2011 | Gao | H01L 29/7786 257/190 |
| 2013/0292700 A1 | 11/2013 | Teramoto et al. | |

FOREIGN PATENT DOCUMENTS

| | | |
|---|---|---|
| JP | 2008205146 A | 9/2008 |
| KR | 100413523 | 1/2004 |
| KR | 1020090023110 | 3/2009 |
| KR | 100894810 | 4/2009 |
| KR | 100920434 B1 | 10/2009 |

* cited by examiner

METHODS OF MANUFACTURING HIGH ELECTRON MOBILITY TRANSISTORS

CROSS-REFERENCE TO RELATED APPLICATION

This is a divisional patent application of U.S. patent application Ser. No. 13/178,902 filed on Jul. 8, 2011 and claims priority under 35 U.S.C. §119 to Korean Patent Application No. 10-2010-0097417, filed on Oct. 6, 2010, in the Korean Intellectual Property Office (KIPO), the entire contents of each of which is incorporated herein by reference.

BACKGROUND

1. Field

Example embodiments relate to methods of manufacturing semiconductor devices.

2. Description of the Related Art

High electron mobility transistor (HEMTs) include semiconductors with different band gaps and/or polarizabilities. The semiconductors are combined to form a heterojunction. A first semiconductor with a large band gap and/or large polarizability operates as a donor. A 2-dimensional electron gas (2DEG) is induced in a second semiconductor with a smaller band gap and/or polarizability by the first semiconductor, at the heterojunction between the first and second semiconductors. The 2DEG may be used as a channel in the HEMT.

A HEMT may be used as an increased electron mobility semiconductor device and/or as a power transistor. A HEMT may include a semiconductor with a wide band gap, for example a compound semiconductor. Accordingly, a breakdown voltage of the HEMT may be high.

SUMMARY

Example embodiments may provide methods of manufacturing metal-oxide semiconductor field effect transistor (MOSFET) type normally-off high electron mobility transistors (HEMTs) with high and/or improved output using impurity injection.

According to example embodiments, a method of manufacturing a high electron mobility transistor (HEMT) includes forming a first material layer on a substrate, increasing electric resistance of the first material layer, forming a source pattern and a drain pattern, which are spaced apart from each other, on the first material layer having increased electric resistance, forming a gate insulation layer on the first material layer, between the source pattern and the drain pattern, and forming a gate electrode, a source electrode, and a drain electrode respectively on the gate insulation layer, the source pattern, and the drain pattern. The source pattern and the drain pattern are formed of a material having a higher band gap than the first material layer.

The increasing of the electric resistance of the first material layer may include injecting impurities in the first material layer. The forming of the source pattern and the drain pattern may include forming a second material layer having a higher band gap than the first material layer, on the first material layer having the increased electric resistance and forming the source and drain patterns by patterning the second material layer. The forming of the source pattern and the drain pattern may include forming a growth blocking layer defining an area where the source and drain patterns are to be formed on the first material layer having the increased electric resistance, and covering an area where the gate electrode is to be formed, forming the source and drain patterns in the defined area of the first material layer having the increased electric resistance and removing the growth blocking layer.

The growth blocking layer may have a thickness for blocking injection of the impurities. The growth blocking layer may have a thickness for penetrating through the impurities. A thickness of the growth blocking layer for defining the area where the source and drain patterns are to be formed, and a thickness of the growth blocking layer for covering the area where the gate electrode is to be formed may be different from each other. If the growth blocking layer has a thickness that blocks injection of impurities, the method may further include, after removing the growth blocking layer, injecting impurities into an area where the growth blocking layer for defining the area where the source and drain patterns are to be formed is removed.

According to further example embodiments, a method of manufacturing a high electron mobility transistor (HEMT) includes forming a first layer including a first material on a substrate, increasing an electrical resistance of at least a part of the first layer, forming a source pattern and a drain pattern spaced apart from each other on the first layer, the source and drain patterns including a third material, a band gap of the third material greater than a band gap of the first material, forming a gate insulation layer on the first layer between the source pattern and the drain pattern, forming a gate electrode on the gate insulation layer, forming a source electrode on the source pattern, and forming a drain electrode on the drain pattern.

BRIEF DESCRIPTION OF THE DRAWINGS

Example embodiments will be more clearly understood from the following brief description taken in conjunction with the accompanying drawings.

FIGS. 1-6 are cross-sectional diagrams illustrating methods of manufacturing high electron mobility transistors (HEMTs) according to example embodiments;

FIGS. 7-11 are cross-sectional diagrams illustrating methods of manufacturing HEMTs according to other example embodiments;

FIGS. 12-17 are cross-sectional diagrams illustrating methods of manufacturing HEMTs according to still other example embodiments; and FIGS. 18-20 are cross-sectional diagrams illustrating methods of manufacturing HEMTs according to yet other example embodiments.

Figure 1:
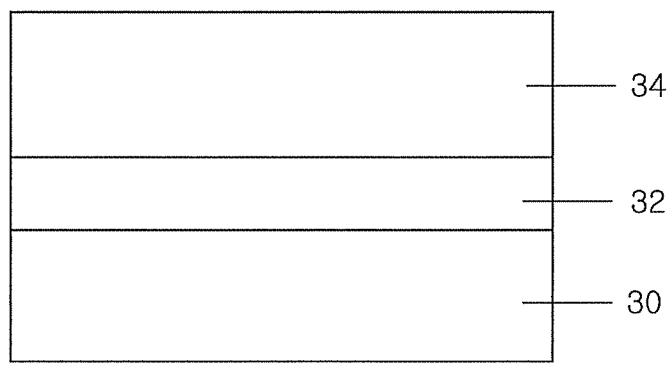
FIGS. 1-20 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1-6 are cross-sectional diagrams illustrating methods of manufacturing high electron mobility transistors (HEMTs) according to example embodiments. Referring to FIG. 1, a buffer layer 32 may be formed on a substrate 30. The substrate 30 may be, for example, a sapphire substrate, a silicon (Si) substrate, and/or a silicon carbide (SiC) substrate. A first material layer 34 may be formed on the buffer layer 32. The first material layer 34 may be a compound semiconductor layer. For example, the first material layer 34 may be an un-doped gallium nitride (GaN) layer. The first material layer 34 may be, for example, an aluminium gallium arsenide (AlGaAs) layer. The first material layer 34 may be formed by using, for example, an epitaxial growth method.

Figure 2:
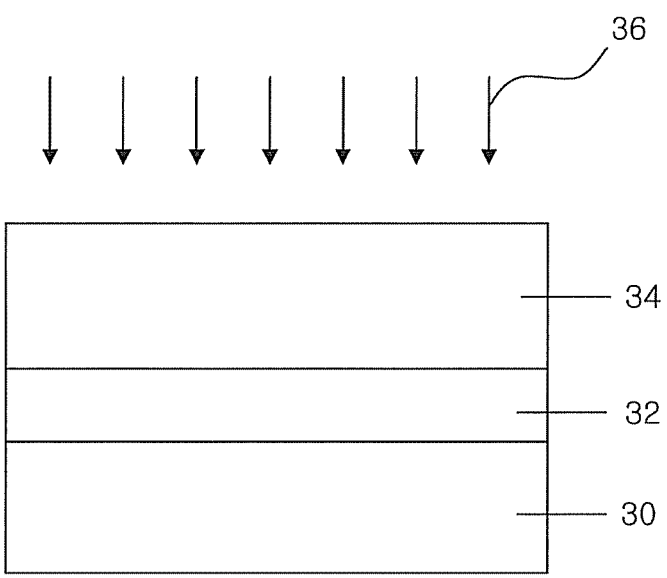
Figure 3:
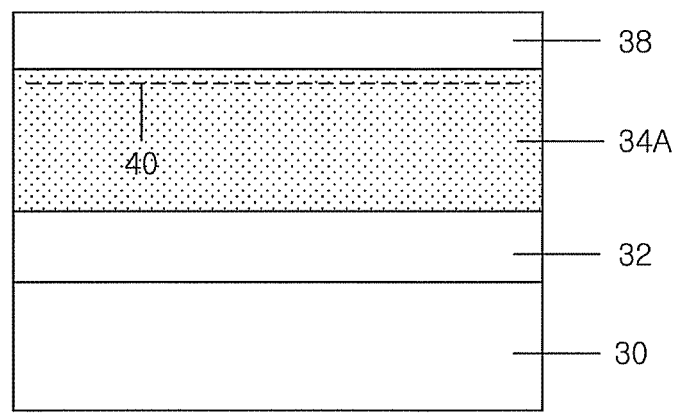

Referring to FIGS. 2 and 3, the first material layer 34 may be doped with impurities 36. The impurities 36 may be distributed throughout the entire first material layer 34 to form an impurity doped first material layer 34A. The first material layer 34 may be doped with the impurities 36 by, for example, using an ion injection method. The impurities 36 may include, for example, argon (Ar). The impurities 36 may include, for example, a halogen element, an alkali metal, an alkali earth metal, a group-VI element in the periodic table and/or a transition metal. For example, the halogen element may be neon (Ne), Ar and/or krypton (Kr). The alkali metal may be lithium (Li), sodium (Na) and/or potassium (K). The alkali earth metal may be beryllium (Be), magnesium (Mg) and/or calcium (Ca). The group-VI element may be carbon (C), Si and/or germanium (Ge). The transition metal may be manganese (Mn), iron (Fe) and/or chromium (Cr). By injecting the impurities 36, a lattice structure and/or a crystalline structure of the first material layer 34 may be disrupted. A resistance of the impurity doped first material layer 34A may be a high and/or increased resistance.

Referring to FIG. 3, a second material layer 38 may be formed on the impurity doped first material layer 34A. The second material layer 38 may be formed by using, for example, an epitaxial growth method. A polarizability and/or band gap of the second material layer 38 may be greater than a polarizability and/or band gap of the first material layer 34. When the second material layer 38 is formed, polarization may be induced in the second material layer 38 due to a difference between the polarizabilities of the first and second material layers 34A and 38 and a 2DEG 40 may be induced in the first material layer 34A. A 2-dimensional electron gas (2DEG) 40 may be induced adjacent to an interface between the first material layer 34A and the second material layer 38. The second material layer 38 may be, for example, an AlGaN layer and/or a GaAs layer.

Figure 4:
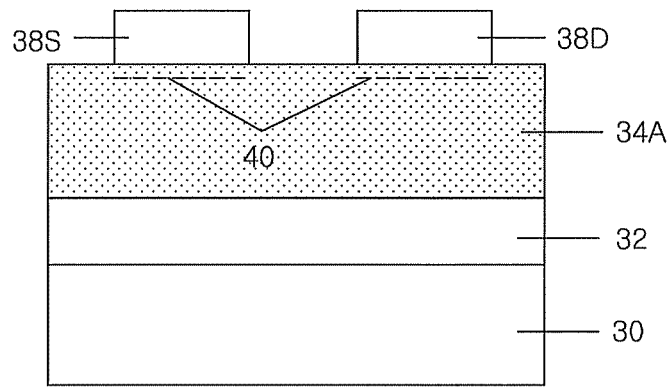

The second material layer 38 may be patterned to form second material layer patterns 38S and 38D, which may be spaced apart from each other, as illustrated in FIG. 4. The second material layer pattern 38S (hereinafter, referred to as a source pattern) may define a source region, and the second material layer pattern 38D (hereinafter, referred to as a drain pattern) may define a drain region. The second material layer 38 may be patterned by using, for example, an etch method (e.g., an anisotropic etch). Because the 2DEG 40 may be induced according to the polarization of the second material layer 38, the 2DEG 40 may exist below the source pattern 38S and the drain pattern 38D, and may not exist (in an unbiased state of the HEMT) in other regions.

Figure 5:
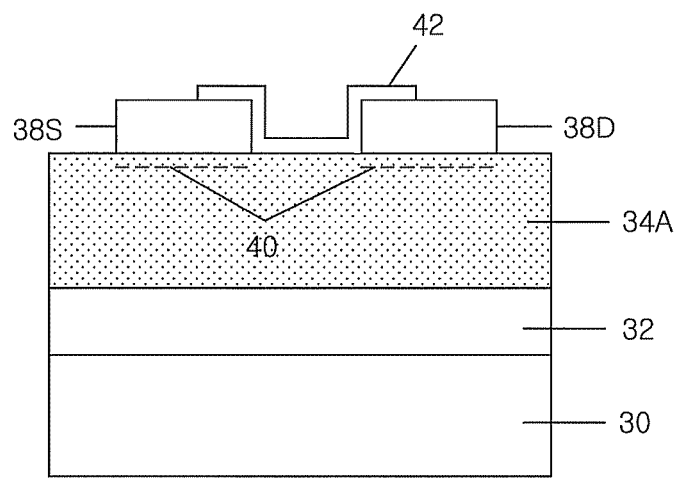
Figure 6:
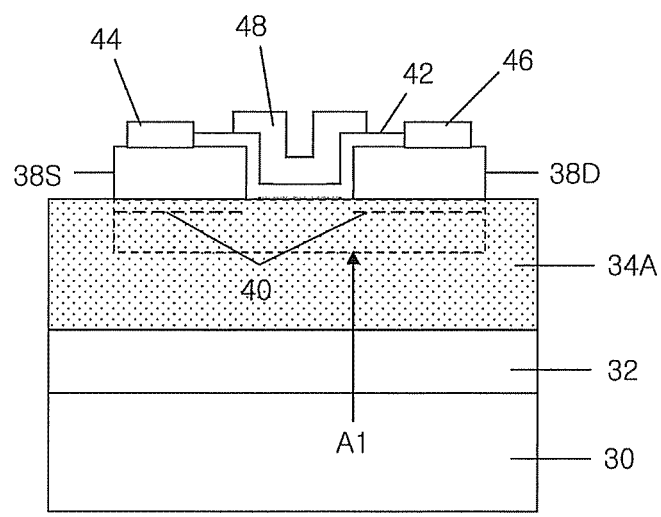

Referring to FIG. 5, a gate insulation layer 42 may be formed on the impurity doped first material layer 34A between the source and drain patterns 38S and 38D. The gate insulation layer 42 may be, for example, a silicon oxide layer and/or a nitride layer. The gate insulation layer 42 may overlap with the source and drain patterns 38S and 38D. Referring to FIG. 6, a gate electrode 48 may be formed on the gate insulation layer 42. A source electrode 44 and a drain electrode 46 may be respectively formed on the source pattern 38S and the drain pattern 38D. The source electrode 44 and the drain electrode 46 may be spaced apart from the gate electrode 48, and may be insulated from each other by the gate insulation layer 42. The gate electrode 48, the source electrode 44, and the drain electrode 46 may be formed by forming a conductive layer (not shown) covering the gate insulation layer 42, the source pattern 38S, and the drain pattern 38D, and patterning the conductive layer by using, for example, photolithographic and etch processes.

The conductive layer may be a single layer or a multi-layer. The conductive layer may be a metal layer and/or a silicide layer with low contact resistance to the source and drain patterns 38S and 38D. The gate electrode 48 may be formed at the same time as the source and drain electrodes 44 and 46, or before or after forming the source and drain electrodes 44 and 46. A metal-oxide semiconductor field effect transistor (MOSFET) type normally-off HEMT may be formed. A resistance of the impurity doped first material layer 34A may be a high and/or increased resistance due to the doped impurity. A current leaked outside a transistor region A1 of the impurity doped first material layer 34A in the source region (e.g., a buffer leakage current) may be reduced. An electric device separation characteristic between HEMTs formed on the impurity doped first material layer 34A may be excellent and/or improved due to the high resistance characteristic of the impurity doped first material layer 34A.

Figure 7:
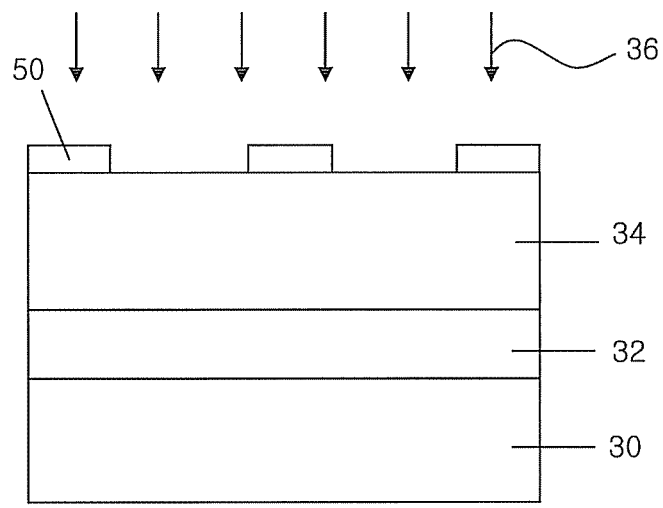

FIGS. 7-11 are cross-sectional diagrams illustrating methods of manufacturing HEMTs according to other example embodiments. Referring to FIG. 7, a substrate 30, a buffer layer 32 and a first material layer 34 may be formed (e.g., sequentially formed). A growth blocking layer 50 may be formed on the first material layer 34. The growth blocking layer 50 may be a material layer blocking and/or interrupting epitaxial growth. The growth blocking layer 50 may not be formed on an entire top surface of the first material layer 34. The growth blocking layer 50 may be formed on regions excluding a source region S1 and a drain region D1, which may be spaced apart from each other, on the top surface of the first material layer 34.

Figure 8:
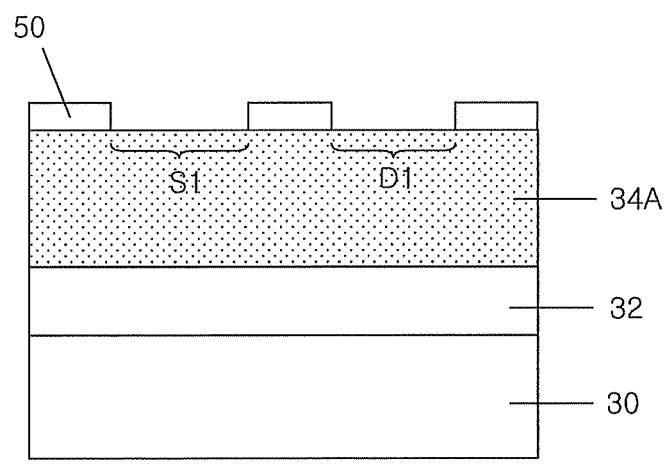

The growth blocking layer 50 formed on the first material layer 34 between the source and drain regions S1 and D1 may define a gate region in which a gate electrode may be formed. A thickness of the growth blocking layer 50 may be thin enough for impurities 36 to pass through during a doping process. The growth blocking layer 50 may be an amorphous layer, for example, an oxide layer and/or a nitride layer. The impurities 36 may be injected into the first material layer 34, for example, after forming the growth blocking layer 50. Because the thickness of the growth blocking layer 50 may be thin enough for the impurities 36 to pass through, the impurities 36 may be injected into the entire first material layer 34. FIG. 8 illustrates the impurity doped first material layer 34A into which the impurities 36 have been injected. A resistance of the impurity doped first material layer 34A may be a high resistance.

Figure 9:
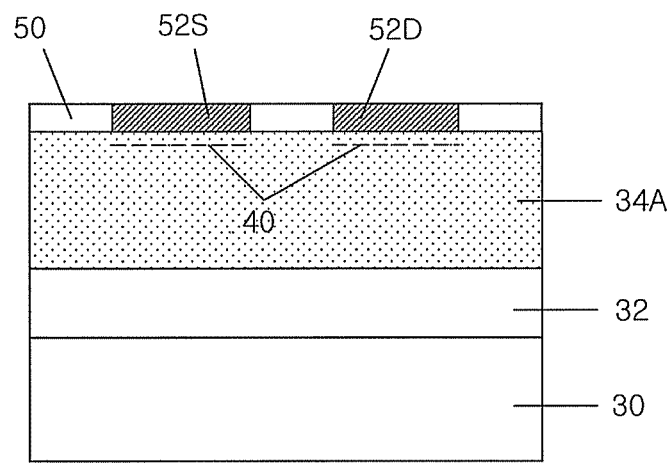

Referring to FIG. 9, a source pattern 52S and a drain pattern 52D may be respectively formed on the source and drain regions S1 and D1 of the impurity doped first material layer 34A. The source and drain patterns 52S and 52D may be formed by using, for example, an epitaxial growth method. Because regions excluding the source and drain regions S1 and D1 on the top surface of the impurity doped first material layer 34A are covered by the growth blocking layer 50, a material layer may not be grown on the regions excluding the source and drain regions S1 and D1 while growing source and drain patterns 52S and 52D. A band gap and/or polarizability of the source and drain patterns 52S and 52D may be greater than a band gap and/or polarizability of the impurity doped first material layer 34A.

Figure 10:
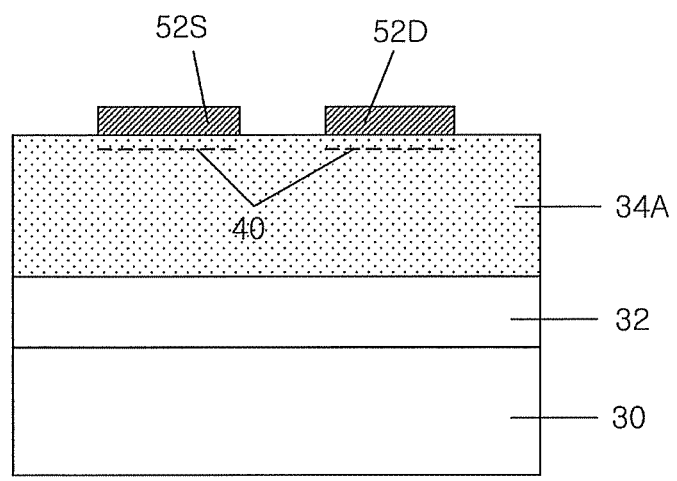

Because the source and drain patterns 52S and 52D may be respectively formed on the source and drain regions S1 and D1, the 2DEG 40 may be induced in the source and drain regions S1 and D1 of the impurity doped first material layer 34A and may not be induced outside of the source and drain regions S1 and D1. The source and drain patterns 52S and 52D may be formed, for example, to a same thickness as the growth blocking layer 50. The growth blocking layer 50 may be removed (e.g., after forming the source and drain patterns 52S and 52D). FIG. 10 may illustrate a resultant product after the growth blocking layer 50 is removed. As illustrated in FIG. 10, the source and drain patterns 52S and 52D may be spaced apart from each other on the impurity doped first material layer 34A.

Figure 11:
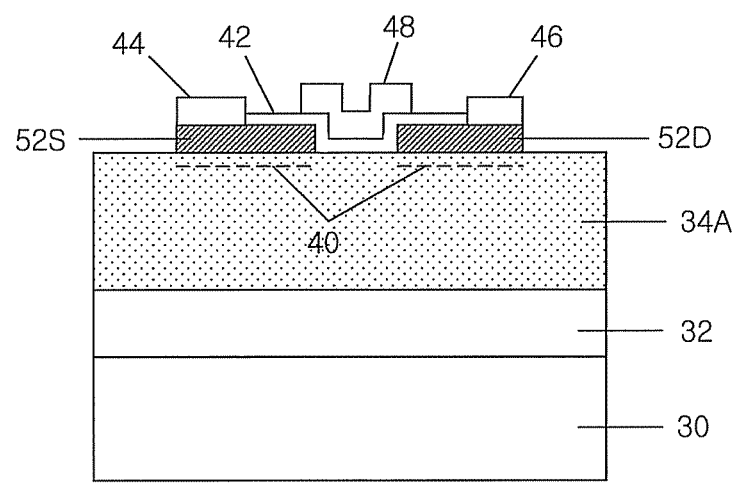

Referring to FIG. 11, a gate insulation layer 42 may be formed on the impurity doped first material layer 34A between the source and drain patterns 52S and 52D. The gate electrode 48 may be formed on the gate insulation layer 42. A source electrode 44 may be formed on the source pattern 52S. A drain electrode 46 may be formed on the drain pattern 52D. Relationships and forming methods of the gate insulation layer 42, the gate electrode 48, the source electrode 44, and the drain electrode 46 may be identical or similar to those described with respect to FIGS. 1-6. Because the thickness of the growth blocking layer 50 may be thin enough for the impurities 36 to pass through, a threshold voltage of the HEMT may be adjusted according to the injection of the impurities 36. Because the gate electrode 48 may be formed on a location where the growth blocking layer 50 may be removed, a normally-off HEMT may be manufactured without having to perform a separate gate patterning process. A distribution of the impurities 36 may be non-uniform in the first material layer 34A.

FIGS. 12-17 are cross-sectional diagrams illustrating methods of manufacturing HEMTs according to still other example embodiments. A growth blocking layer 60 of example embodiments described with respect to FIGS. 12-17 may be thicker than a growth blocking layer 50 of example embodiments described with respect to FIGS. 7-11. For example, thickness of a growth blocking layer 60 may be such that the impurities 36 may not pass through. Functions of a growth blocking layer 60 may be identical or similar to those of a growth blocking layer 50. A process of forming the growth blocking layer 60 on the first material layer 34 and injecting the impurities 36 shown in FIG. 12 may be performed in the same or similar manner to that described with reference to FIG. 7. A material of the growth blocking layer 60 may be identical or similar to that of the growth blocking layer 50. A thickness of the growth blocking layer 60 may be thicker than a thickness of a growth blocking layer 50, and may be thick enough to block the impurities 36.

Figure 12:
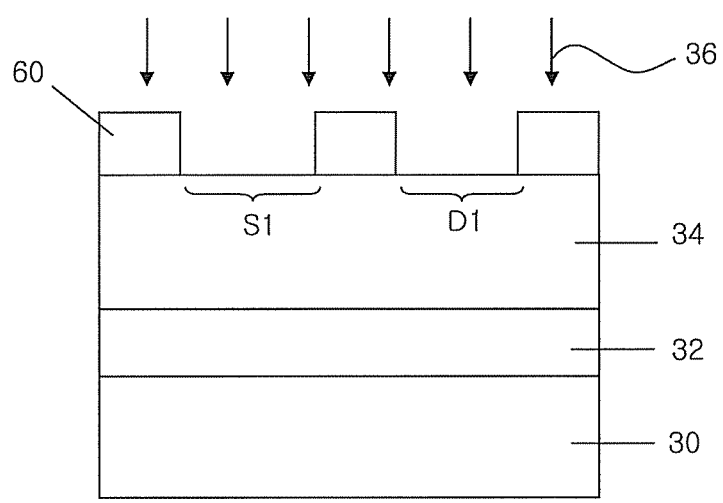
Figure 13:
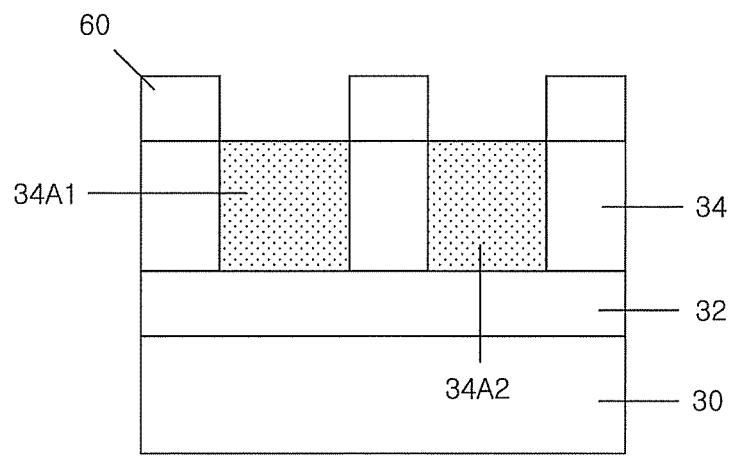

When impurities 36 are injected as illustrated in FIG. 12, the impurities 36 may not be injected into a region of the first material layer 34 covered by the growth blocking layer 60. The impurities 36 may be injected into source and drain regions S1 and D1 of the first material layer 34, and the first material layer 34 may include the first and second impurity regions 34A1 and 34A2, which may be spaced apart from each other, as illustrated in FIG. 13. Because the impurities 36 may not be injected into a region of the first material layer 34 where a gate electrode may be formed due to the growth blocking layer 60, a threshold voltage Vth of the HEMT may not be increased and/or excessively increased.

Figure 14:
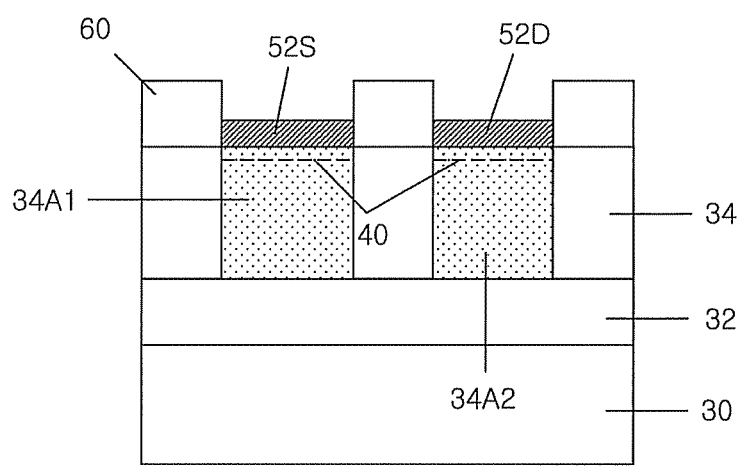
Figure 15:
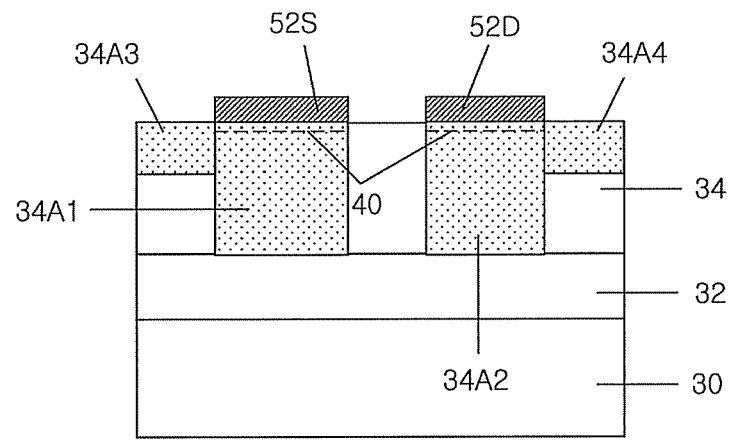

Referring to FIG. 14, the source pattern 52S and the drain pattern 52D may be respectively grown on the first and second impurity regions 34A1 and 34A2 of the first material layer 34. Thicknesses of the source and drain patterns 52S and 52D may be thinner than a thickness of the growth blocking layer 60. The growth blocking layer 60 may be removed (e.g., after forming the source and drain patterns 52S and 52D). A mask (not shown) for masking the source and drain patterns 52S and 52D, and the first material layer 34 between the source and drain patterns 52S and 52D may be formed. Second impurities (not shown) may be injected into the first material layer 34. Due to the mask, a region of the first material layer 34 where the second impurities may be injected may be limited to an outer region of the source pattern 52S and an outer region of the drain pattern 52D. Referring to FIG. 15, a third impurity region 34A3 may be formed on the outer region of the source pattern 52S, and a fourth impurity region 34A4 may be formed on the outer region of the drain pattern 52D.

The second impurities may be identical or similar to the impurities 36, and thus effects of the second impurities may be identical or similar to the impurities 36. Because the third or fourth impurity regions 34A3 or 34A4, which may be high resistance regions, exist between HEMTs formed on the first material layer 34 due to the injection of the second impurities, the HEMTs may be electrically separated (e.g., completely isolated) from each other. Injection energy of the second impurities may be less than injection energy of the impurities 36. The third and fourth impurity regions 34A3 and 34A4 may exist in an upper portion of the first material layer 34 as shown in FIG. 15. Depths of the third and fourth impurity regions 34A3 and 34A4 may be shallower or deeper than illustrated in FIG. 15 according to the injection energy of the second impurities. The mask may be removed (e.g., after injecting the second impurities).

Figure 16:
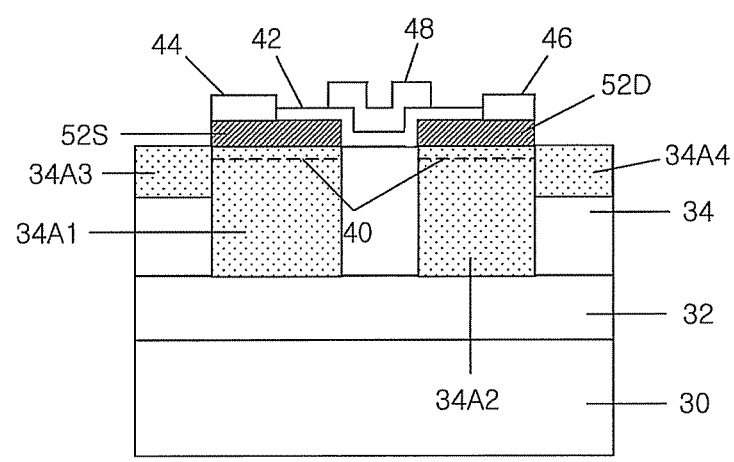

A process of forming the gate insulation layer 42, which may partially extend onto the source and drain patterns 52S and 52D from the first material layer 34 between the source and drain patterns 52S and 52D, and a process of forming the gate electrode 48 on the gate insulation layer 42, and forming the source and drain electrodes 44 and 46 respectively on the source and drain patterns 52S and 52D, are illustrated in FIG. 16. Such processes may be identical or similar to those described with respect to FIGS. 1-11.

Figure 17:
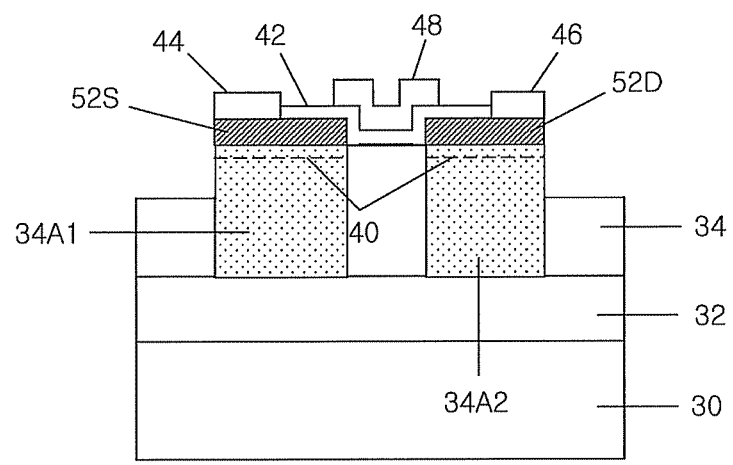

Because the gate electrode 48 may be simply formed in a location where the growth blocking layer 60 may be removed, a normally-off HEMT may be formed without performance of a separate gate patterning process. According to at least one example embodiment, regions corresponding to the third and fourth impurity regions 34A3 and 34A4 may be removed from the first material layer 34 as illustrated in FIG. 17, by using, for example, a mesa process. For example, instead of forming the third and fourth impurity regions 34A3 and 34A4 on the first material layer 34 as shown in FIG. 15, regions corresponding to the third and fourth impurity regions 34A3 and 34A4 may be removed from the first material layer 34. An effect of removing the regions corresponding to the third and fourth impurity regions 34A3 and 34A4 may be identical or similar to an effect of forming the third and fourth impurity regions 34A3 and 34A4.

Figure 18:
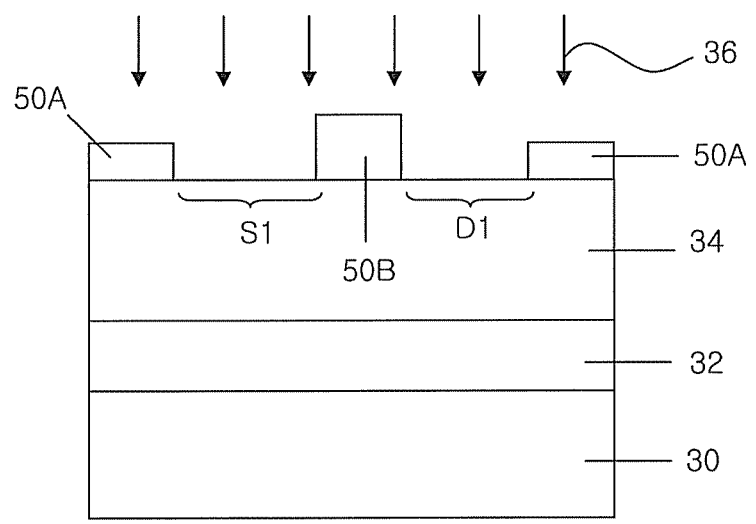
Figure 19:
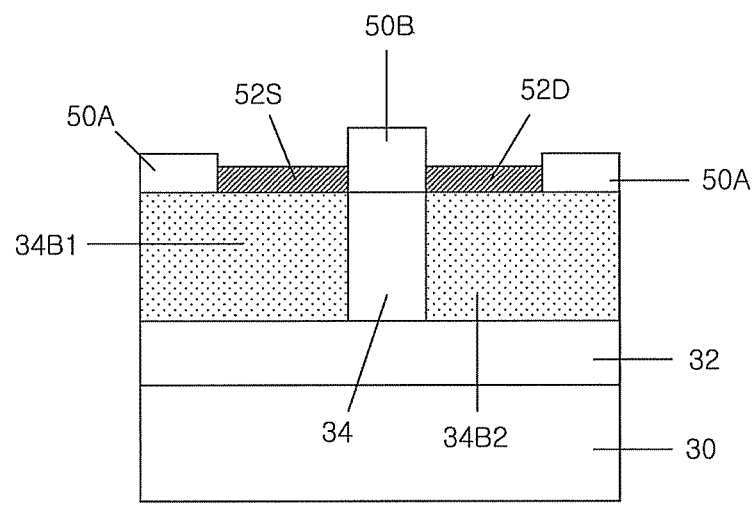
Figure 20:
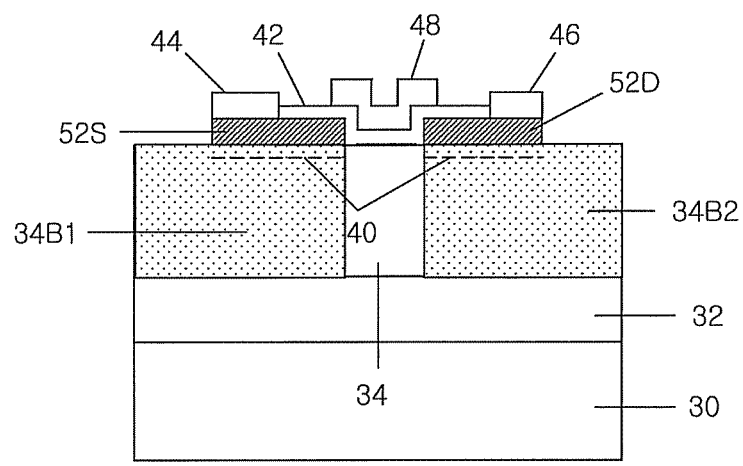

FIGS. 18-20 are cross-sectional diagrams illustrating methods of manufacturing HEMTs according to yet other example embodiments. Referring to FIG. 18, a first growth blocking layer 50A and a second growth blocking layer 50B may be formed on the first material layer 34. The second growth blocking layer 50B may be thicker than the first growth blocking layer 50A, or vice versa. The second growth blocking layer 50B may define a gate region. The first growth blocking layer 50A may define the source and drain regions S1 and D1. Materials of the first and second growth blocking layers 50A and 50B may be identical or similar, and may be identical or similar to those of the growth blocking layers 50 and 60 according to example embodiments.

The impurities 36 may be injected into the first material layer 34 (e.g., after forming the first and second growth blocking layers 50A and 50B). Due to a difference between thicknesses of the first and second growth blocking layers 50A and 50B, the impurities 36 may not be injected into the first material layer 34 below the second growth blocking layer 50B as illustrated in FIG. 19. The impurities 36 may be injected through the second growth blocking layer 50A. The first material layer 34 may include fifth and sixth impurity regions 34B1 and 34B2, which are spaced apart from each other, as illustrated in FIG. 19. The source and drain patterns 52S and 52D may be respectively formed on the source and drain regions S1 and D1 of the first material layer 34. The gate insulation layer 42, the gate electrode 48, the source electrode 44, and the drain electrode 46 may be formed as shown in FIG. 20, identically or similarly to example embodiments described with reference to FIGS. 1-17.

According to the one or more example embodiments a buffer leakage current may be reduced by increasing the electric resistance of a material layer including a 2DEG. Device separation characteristics between neighbouring HEMTs may be increased by using methods of manufacturing HEMTs according to example embodiments.

While example embodiments have been particularly shown and described, it will be understood by one of ordinary skill in the art that variations in form and detail may be made therein without departing from the spirit and scope of the claims.

What is claimed is:

1. A method of manufacturing a high electron mobility transistor (HEMT), comprising:

forming a first layer including a first material on a substrate;

after the first layer is completely formed, increasing an electrical resistance of at least a part of the first layer;

after the electrical resistance of at least a part of the first layer is increased, forming a source pattern and a drain pattern spaced apart from each other on the first layer, the source and drain patterns including a second material, a band gap of the second material greater than a band gap of the first material;

forming a gate insulation layer on the first layer between the source pattern and the drain pattern;

forming a gate electrode on the gate insulation layer;

forming a source electrode on the source pattern; and forming a drain electrode on the drain pattern, wherein the forming of the source pattern and the drain pattern includes forming a growth blocking layer on a channel region and a peripheral region of the first layer such that regions of the first layer corresponding to the source and drain patterns are exposed, depositing the second material onto the exposed regions of the first layer, and removing the growth blocking layer.

2. The method of claim 1, wherein the increasing of the electrical resistance of the at least part of the first layer includes injecting impurities into the first layer.

3. The method of claim 1, wherein the increasing includes injecting impurities into the first material, and the forming a source pattern and a drain pattern includes forming the growth blocking layer to a thickness that substantially blocks the impurities from reaching the first layer during the injection of the impurities.

4. The method of claim 1, wherein the increasing includes injecting impurities into the first layer, and the forming a source pattern and a drain pattern includes forming the growth blocking layer to a thickness that the impurities are penetrated during the injection of the impurities.

5. The method of claim 1, wherein the forming a source pattern and a drain pattern includes forming the growth blocking layer on the channel region to a different thickness from the growth blocking layer on the peripheral region.

6. The method of claim 3, further comprising:

injecting impurities into the peripheral region after the removing of the growth blocking layer.

7. The method of claim 1, wherein the first material is GaN and the second material is AlGaN.

* * * * *